(12) United States Patent
Saint Victor et al.

(10) Patent No.: US 6,680,347 B1
(45) Date of Patent: Jan. 20, 2004

(54) SELF-DISPERSIBLE EPOXIDE/SURFACTANT COATING COMPOSITIONS

(75) Inventors: Marie-Esther Saint Victor, Cincinnati, OH (US); Grannis S. Johnson, Durham, NC (US)

(73) Assignee: Cognis Corporation, Ambler, PA (US)

( * ) Notice: Subject to any disclaimer, the term of this patent is extended or adjusted under 35 U.S.C. 154(b) by 105 days.

(21) Appl. No.: 09/662,540

(22) Filed: Sep. 15, 2000

Related U.S. Application Data

(60) Provisional application No. 60/157,710, filed on Oct. 5, 1999.

(51) Int. Cl.$^7$ ............... C08J 3/28; C08J 3/03; C09D 143/04; C09D 163/00
(52) U.S. Cl. ............... 522/31; 522/84; 522/85; 522/86; 522/88; 522/146; 522/148; 522/170; 522/172; 522/181; 524/588; 524/837; 524/800; 524/732; 524/612
(58) Field of Search ............... 522/31, 84, 85, 522/86, 88, 172, 181, 170, 148, 146; 523/424, 425, 427; 524/837, 865, 588, 800, 801, 612, 732

(56) References Cited

U.S. PATENT DOCUMENTS

| | | | |
|---|---|---|---|
| 1,985,424 A | | 12/1934 | Piggott |
| 2,569,502 A | | 10/1951 | Swern et al. |
| 2,965,576 A | | 12/1960 | Wilson |
| 4,504,374 A | * | 3/1985 | Lewarchik et al. |
| 4,645,781 A | * | 2/1987 | Koleske et al. |
| 4,977,199 A | * | 12/1990 | Koleske et al. |
| 5,194,639 A | | 3/1993 | Connor et al. |
| 5,266,690 A | | 11/1993 | McCurry et al. |
| 5,334,764 A | | 8/1994 | Scheibel et al. |
| 5,439,779 A | * | 8/1995 | Day et al. |
| 5,449,763 A | | 9/1995 | Wulff et al. |
| 5,889,084 A | * | 3/1999 | Roth |

* cited by examiner

Primary Examiner—Susan W. Berman
(74) Attorney, Agent, or Firm—John E. Drach; Steven J. Trzaska

(57) ABSTRACT

A process for making a self-dispersible, radiation curable coating composition involving: (a) providing a cationic oligomer; (b) providing an epoxy functional monomer; (c) providing a surfactant component; (d) providing a transfer agent; (e) providing a photoinitiator; and (f) mixing (a)–(e) to form the coating composition.

49 Claims, No Drawings

US 6,680,347 B1

SELF-DISPERSIBLE EPOXIDE/SURFACTANT COATING COMPOSITIONS

CROSS-REFERENCE TO RELATED APPLICATIONS

This application claims the benefit of provisional application Ser. No. 60/157,710 filed on Oct. 5, 1999.

STATEMENT REGARDING FEDERALLY SPONSORED RESEARCH OR DEVELOPMENT

Not applicable.

BACKGROUND OF THE INVENTION

Photocurable coatings, known in the industry as UV curables, possess various characteristics which render their use highly desirable for applications requiring the formation of a coating. These characteristics include: (1) they are comprised of 100% reactive components which provide for environmentally acceptable coatings, (2) they are energy efficient requiring a small fraction of the energy normally consumed in thermally cured coating, (3) they can easily be formulated to meet a variety of applications since functionalized monomers and oligomers are available covering a wide range of properties, (4) the UV curing process in itself often imparts desirable properties to the cured coating, which cannot be achieved with thermally cured coatings and, (5) due to the wide range of viscosities inherent in the reactive monomers used in UV curable components, coating can be readily formulated to meet demanding viscosity requirements dictated by certain coatings applications.

There are two primary types of UV curable systems. The first proceeds by a free radical chain process in which low molecular weight monomers and oligomers are converted by absorption to UV radiation into highly-crosslinked, chemically-resistant films. The second type of UV curable system, which shows great promise for the future, polymerizes by a cationic mechanism and has the advantage of oxygen insensitivity compared to free-radical photocurable systems.

In general, cationic photocure systems are often deemed superior to free-radical photocuring processes for the following reasons: (a) they are readily sensitized by dyes and/or polycyclic aromatics, (b) they are insensitive to oxygen inhibitors, (c) they are terminated only by impurity quenching, and (d) they are characterized by an efficient post thermal cure.

One drawback associated with the use of cationic polymeric oligomers stems from their being poor film formers when used alone, i.e., they cure much more slowly than acrylate oligomers when irradiated with UV light. When they are blended with an appropriate reactive diluent, they form highly flexible films possessing desirable mechanical and physical properties. However, due to their slow cure rate, their use in quick-curing applications where time is of the essence, up to now, has been prohibited.

BRIEF SUMMARY OF THE INVENTION

The present invention is directed to a process for making a self-dispersible, radiation curable coating composition involving:

(a) providing from about 10 to about 90% by weight of a cationic oligomer;

(b) providing from about 10 to about 90% by weight of an epoxy functional monomer;

(c) providing from about 0 to about 30% by weight of a surfactant component;

(d) providing from about 0 to about 10% by weight of a transfer agent;

(e) providing from about 1 to about 10% by weight of a photoinitiator, all weights being based on the weight of the composition; and (f) mixing (a)–(e) to form the coating composition.

The present invention is also directed to a process for coating a substrate involving applying the above-disclosed radiation curable coating composition onto a surface of the substrate.

BRIEF DESCRIPTION OF THE SEVERAL VIEWS OF THE DRAWING

Not applicable.

DETAILED DESCRIPTION OF THE INVENTION

Other than in the operating examples, or where otherwise indicated, all numbers expressing quantities of ingredients or reaction conditions are to be understood as being modified in all instances by the term "about".

Cationic oligomers which may be employed by the present invention include epoxy oligomers, cycloaliphatic epoxy oligomers, vinyl ether oligomers, butyryl oligomers, unsaturated polyester oligomers and organosilicone oligomers.

Useful epoxy oligomers include those derived from glycidyl ethers of both polyhydric phenols and polyhydric alcohols, epoxidized fatty acids or drying oil acids, epoxidized diolefins, epoxidized di-unsaturated acid esters, as well as epoxidized unsaturated polyesters, preferably containing an average of more than one epoxide group per molecule. The preferred epoxy oligomers will have a molecular weight of from about 300 to about 600 and an epoxy equivalent weight of between about 150 and about 1,200. Representative examples of epoxy oligomers include condensation products of polyphenols and (methyl) epichlorohydrin. For the polyphenols, there may be listed bisphenol A, 2,2'-bis(4-hydroxyphenyl)methane (bisphenol F), halogenated bisphenol A, resorcinol, hydroquinone, catechol, tetrahydroxyphenylethane, phenol novolac, cresol novolac, bisphenol A novolac and bisphenol F novolac. There may also be listed epoxy compounds of the alcohol ether type obtainable from polyols such as alkylene glycols and polyalkylene glycols, e.g. ethylene glycol, 1,2-propylene glycol, 1,3-propylene glycol, 1,4-butanediol, 1,6-hexanediol, neopentyl glycol, glycerine, diglycerol, trimethylolpropane, pentaerythritol, inositol, sorbitol, polyethylene glycol, polypropylene glycol, polytetrahydrofuran, (i.e., poly(1,4-butanediol), which is obtainable under the designation TERATHONE® from DuPont), and alkylene oxide-adduct of bisphenols, and (methyl)epichlorohydrin; glycidyl amines obtainable from anilines such as diaminodiphenylmethane, diaminophenylsulfone and p-aminophenol, and (methyl)epichlorohydrin; glycidyl esters based on acid anhydrides such as phthalic anhydride and tetrahydro- or hexahydro-phthalic anhydride; and alicyclic epoxides such as 3,4-epoxy-6-methylcyclohexylmethyl and 3,4-epoxy-6-methylcyclohexyl carboxylate.

Glycidyl polyethers of polyhydric phenols are made from the reaction of a polyhydric phenol with epihalohydrin or glycerol dihalohydrin, and a sufficient amount of caustic alkali to combine with the halogen of the halohydrin. Glycidyl ethers of polyhydric alcohols are made by reacting at least about 2 moles of an epihalohydrin with 1 mole of a polyhydric alcohol such as ethylene glycol, pentaerythritol, etc., followed by dehydrohalogenation.

In addition to polyepoxides made from alcohols or phenols and an epihalohydrin, polyepoxides made by the known peracid methods are also suitable. Epoxides of unsaturated esters, polyesters, diolefins and the like can be prepared by reacting the unsaturated compound with a peracid. Preparation of polyepoxides by the peracid method is described in various periodicals and patents and such compounds as butadiene, ethyl linoleate, as well as di- or tri-unsaturated drying oils or drying oil acids, esters and polyesters can all be converted to polyepoxides. Epoxidized drying oils are also well known, these polyepoxides usually being prepared by reaction of a peracid such as peracetic acid or performic acid with the unsaturated drying oil according to U.S. Pat. No. 2,569,502.

In certain embodiments, the diepoxide is an epoxidized triglyceride containing unsaturated fatty acids. The epoxidized triglyceride may be produced by epoxidation of one or more triglycerides of vegetable or animal origin. The only requirement is that a substantial percentage of diepoxide compounds should be present. The starting materials may also contain saturated components. However, epoxides of fatty acid glycerol esters having an iodine value of 50 to 150 and preferably 85 to 115 are normally used. For example, epoxidized triglycerides containing 2% to 10% by weight of epoxide oxygen are suitable. The epoxide oxygen content can be established by using triglycerides with a relatively low iodine value as the starting material and thoroughly epoxidizing them or by using triglycerides with a high iodine value as starting material and only partly reacting them to epoxides. Products such as these can be produced from the following fats and oils (listed according to the ranking of their starting iodine value): beef tallow, palm oil, lard, castor oil, peanut oil, rapeseed oil and, preferably, cottonseed oil, soybean oil, train oil, sunflower oil, linseed oil. Examples of typical epoxidized oils are epoxidized soybean oil with an epoxide value of 5.8 to 6.5, epoxidized sunflower oil with an epoxide value of 5.6 to 6.6, epoxidized linseed oil with an epoxide value of 8.2 to 8.6 and epoxidized train oil with an epoxide value of 6.3 to 6.7.

Further examples of polyepoxides include the diglycidyl ether of diethylene glycol or dipropylene glycol, the diglycidyl ether of polypropylene glycols having molecular weight up to, for example, 2,000, the triglycidyl ether of glycerine, the diglycidyl ether of resorcinol, the diglycidyl ether of 4,4'-isopropylidene diphenol, epoxy novolacs, such as the condensation product of 4,4'-methylenediphenol and epichlorohydrin and the condensation of 4,4'-isopropylidenediphenol and epichlorohydrin, glycidyl ethers of cashew nut oil, epoxidized soybean oil, epoxidized unsaturated polyesters, vinyl cyclohexene dioxide, dicyclopentadiene dioxide, dipentene dioxide, epoxidized polybutadiene and epoxidized aldehyde condensates such as 3,4-epoxycyclohexyl methyl-3',4'-epoxycyclohexane carboxylate.

Particularly preferred epoxy oligomers are the glycidyl ethers of bisphenols and epoxy novolac oligomers, a class of compounds which are constituted by a pair of phenolic groups interlinked through an intervening aliphatic bridge. While any of the bisphenols may be used, the compound 2,2-bis (p-hydroxyphenyl)propane, commonly known as bisphenol A, is more widely available in commerce and is preferred. While polyglycidyl ethers can be used, diglycidyl ethers are preferred. Especially preferred are the liquid Bisphenol A-epichlorohydrin condensates with a molecular weight in the range of from 300 to 600.

Suitable vinyl ether oligomers or monomers which may be employed in the present invention include, but are not limited to, those corresponding to the formula $CH_2=CHO—R$ wherein R is an alkyl or aryl group having from about 2 to about 30 carbon atoms. Examples of cationic building blocks are divinyl ether of triethylene glycol, divinyl ether of cyclohexanedimethanol, hydrobutyl vinyl ether and cycloaliphatic epoxy. Examples of vinyl ether include, but are not limited to, triethylene glycol divinyl ether, and 1,4-cyclohexane-dimethanol divinyl ether.

Suitable organosilicone oligomers which may be employed in the present invention include those organic compounds containing silicon-to-carbon bonds and silicon-to-silicon double bonds. Examples thereof include, but are not limited to, epoxy functional silicones, glycidylsilicone and cycloaliphatic silicone derivatives.

A particularly preferred cationic oligomer for use in the present invention is a diglycidyl ether of bisphenol A.

Typical examples of suitable monomers which can be used as reactive diluents include, but are not limited to, alkoxylated polyols corresponding to the formula:

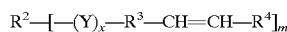

wherein $R^2$ is an aliphatic, aromatic or arene moiety having at least two carbon atoms and at least two oxido residues, Y is an alkylene oxide moiety and x is an integer of from 2 to 6, $R^3$ is a linkage group capable of joining the alkylene oxide moiety Y and the $—CH=CH—$ group, $R^4$ is hydrogen or $—C(O)OR^5$ wherein $R^5$ is hydrogen or an alkyl group of from 1 to 22 carbon atoms, and m is an integer of from 2 to 6.

More particularly, $R^2$ can be an ethylene glycol residue, propylene glycol residue, trimethylol propane residue, pentaerythritol residue, neopentyl glycol residue, glyceryl residue, diglyceryl residue, inositol residue, sorbitol residue, hydroquinone residue, catechol residue, or bisphenol residue (e.g bisphenol A). $R^2$ can also be selected from saturated or unsaturated straight or branched chain aliphatic moieties of from 6 to 24 carbon atoms such as epoxidized soy bean oil residue. Alternatively, $R^2$ can be polyethylene glycol, or ethylene oxide/propylene oxide copolymer.

Y is preferably an ethylene oxide or propylene oxide residue.

$R^3$ can optionally be, for example, the linking groups $—O—$, $—O(O)C—$, $—OCH_2CH_2—$, or $—OCH_2CHOHCH_2O(O)C—$.

A particularly preferred class of monomers for use in the present invention include diglycidyl ethers of both polyhydric phenols and polyhyric alcohols such as, for example, diglycidyl ether of neopentyl glycol, trimethylolpropane triglycidyl ether, polyglycol di-epoxides, triethylene glycol vinyl ether, cyclohexanedimethanol vinyl ether, hydroxybutyl vinyl ether, propenyl ether of propylene carbonate, and dodecyl vinyl ether.

Cationic radiation curable resins are, by themselves water insoluble, hence the need for a surface active agent capable of providing water-dispersibility so that the uncured coating paste can be washed off the application equipment or self-emulsified, especially in applications such as engraving, photographing, developing, and the like, where the unpolymerizable blends have to be washed-off. It is most efficient to include the surface active agent as part of the composition rather than as a component in the wash water. The surface active agents described herein are capable of being integrated into the molecular structure of the cured polymer resulting from the copolymerizable of the oligomer and the alkoxylated polyol monomer components. Integration of the surface active agent into the molecular structure of the cured polymer can be accomplished by, e.g., covalent bonding. For example, the surface active agent can include one or more active sites capable of establishing covalent bonds, such as, for example, unsaturated sites or reactive groups. Alternatively, the surface active agent can be integrated into the molecular structure of the cured polymer by means of hydrogen bonds. In either case the surface active agent possesses the advantage of not migrating within the cured coating. Moreover, integration of the surface active agent prevents water sensitivity of the cured polymer coating which would be caused by the presence of free surfactant.

One type of surface active agent found to be suitable for use in the composition of the present invention includes ethylene oxide/propylene oxide block copolymers. Such copolymers are available from BASF Corporation under the designations PLURONIC® P105, PLURONIC® F108, PLURONIC® F104, and PLURONIC® L44, for example, and have the following formula:

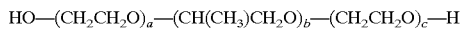

HO—(CH$_2$CH$_2$O)$_a$—(CH(CH$_3$)CH$_2$O)$_b$—(CH$_2$CH$_2$O)$_c$—H wherein b is at least 15 and (CH$_2$CH$_2$O)$_{a+c}$ is varied from 20%–90% by weight.

Another type of surface active agent suitable for use in the composition of the present invention includes ethoxylated acetylenic alcohols and diols such as those available under the designations SURFYNOL® 465 and SURFYNOL® 485(W) from Air Products Co. A preferred surface active agent includes an acetylenic glycol decene diol.

Ethoxylated fatty alcohols such as decyl, tridecyl, lauryl, stearyl and oleyl alcohols such as those available from Cognis Corporation under the tradename TRYCOL® ethoxylated alcohols may also be used.

Similarly, ethoxylated alkylphenols such as those available from Cognis Corporation under the tradename TRYCOL® ethoxylated nonylphenols may also be used.

Yet another type of surface active agent suitable for use in the present invention is a sugar surfactant such as an alkyl polyglycoside and/or a polyhydroxy fatty acid amide. Examples of suitable polyhydroxy fatty acid amides include those corresponding to formula I:

(I)

wherein R$_1$ is H, C$_1$–C$_4$ hydrocarbyl, 2-hydroxy ethyl, 2-hydroxy propyl, or a mixture thereof, preferably C$_1$–C$_4$ alkyl, more preferably C$_1$ or C$_2$ alkyl, most preferably C$_1$ alkyl (i.e., methyl); and R$_2$ is a C$_5$–C$_{31}$ hydrocarbyl moiety, preferably straight chain C$_7$–C$_{19}$ alkyl or alkenyl, more preferably straight chain C$_9$–C$_{17}$ alkyl or alkenyl, most preferably straight chain C$_{11}$–C$_{19}$ alkyl or alkenyl, or mixture thereof; and Y is a polyhydroxyhydrocarbyl moiety having a linear hydrocarbyl chain with at least 3 hydroxyls directly connected to the chain, or an alkoxylated derivative (preferably ethoxylated or propoxylated) thereof. Y preferably will be derived from a reducing sugar in a reductive amination reaction; more preferably Y is a glycityl moiety. Suitable reducing sugars include glucose, fructose, maltose, lactose, galactose, mannose, and xylose. As raw materials, high dextrose corn syrup, high fructose corn syrup, and high maltose corn syrup can be utilized as well as the individual sugars listed above. These corn syrups may yield a mix of sugar components for Y. It should be understood that it is by no means intended to exclude other suitable raw materials. Y preferably will be selected from the group consisting of —CH$_2$—(CHOH)$_n$—CH$_2$OH, —CH(CH$_2$OH)—(CHOH)$_{n-1}$—CH$_2$OH, —CH$_2$—(CHOH)$_2$(CHOR')(CHOH)—CH$_2$OH, where n is an integer from 3 to 5, inclusive, and R' is H or a cyclic mono- or poly-saccharide, and alkoxylated derivatives thereof. Most preferred are glycityls wherein n is 4, particularly —CH$_2$—(CHOH)$_4$—CH$_2$OH. Compounds of the formula I are also known as glucamides. Therefore, when, for example, R$_1$ is methyl, R$_2$ dodecyl; and Y is —CH$_2$—(CHOH)$_4$—CH$_2$OH, the compound in question is referred to as dodecyl N-methylglucamide.

Methods for making polyhydroxy fatty acid amides are known in the art. In general, polyhydroxy fatty acid amides can be made by reductively aminating a reducing sugar reacting with an alkyl amine to form a corresponding N-alkyl polyhydroxyamine and then reacting the N-alkyl polyhydroxyamine with a fatty aliphatic ester or triglyceride to form the N-alkyl, polyhydroxy fatty acid amide. Processes for making polyhydroxy fatty acid amides are disclosed in U.S. Pat. Nos. 1,985,424; 2,965,576; 5,194,639; and 5,334,764 the entire contents of each of which is incorporated herein by reference.

Examples of suitable alkyl polyglycbsides include those corresponding to the formula II:

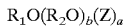

R$_1$O(R$_2$O)$_b$(Z)$_a$    II wherein R$_1$ is a monovalent organic radical having from about 6 to about 30 carbon atoms; R$_2$ is divalent alkylene radical having from 2 to 4 carbon atoms; Z is a saccharide residue having 5 or 6 carbon atoms; b is a number having a value from 0 to about 12; a is a number having a value from 1 to about 6. Preferred alkyl polyglycosides which can be used in the compositions according to the invention have the formula I wherein Z is a glucose residue and b is zero. Such alkyl polyglycosides are commercially available, for example, as APG®, GLUCOPON®, PLANTAREN® or AGRIMUL® surfactants from Cognis Corporation, Ambler, Pa., 19002. Examples of such surfactants include but are not limited to:

1. GLUCOPON® 220 Surfactant—an alkyl polyglycoside in which the alkyl group contains 8 to 10 carbon atoms and having an average degree of polymerization of 1.5.
2. GLUCOPON® 225 Surfactant—an alkyl polyglycoside in which the alkyl group contains 8 to 10 carbon atoms and having an average degree of polymerization of 1.7.
3. GLUCOPON® 600 Surfactant—an alkyl polyglycoside in which the alkyl group contains 12 to 16 carbon atoms and having an average degree of polymerization of 1.4.
20 4. GLUCOPON® 625 Surfactant—an alkyl polyglycoside in which the alkyl group contains 12 to 16 carbon atoms and having an average degree of polymerization of 1.4.
5. APG® 325 Surfactant—an alkyl polyglycoside in which the alkyl group contains 9 to 11 carbon atoms and having an average degree of polymerization of 1.6.
6. PLANTAREN® 2000 Surfactant—an alkyl polyglycoside in which the alkyl group contains 8 to 16 carbon atoms and having an average degree of polymerization of 1.4.
7. PLANTAREN® 1300 Surfactant—an alkyl polyglycoside in which the alkyl group contains 12 to 16 carbon atoms and having an average degree of polymerization of 1.6.

8. AGRIMUL® PG 2067 Surfactant—an alkyl polyglycoside in which the alkyl group contains 8 to 10 carbon atoms and having an average degree of polymerization of 1.7.

Other examples include alkyl polyglycoside surfactant compositions which are comprised of mixtures of compounds of formula I as described in U.S. Pat. Nos. 5,266,690 and 5,449,763, the entire contents of both of which are incorporated herein by reference.

A particularly preferred sugar surfactant for use in the present invention is an alkyl polyglycoside corresponding to formula II wherein $R_1$ is a monovalent organic radical having from about 8 to about 16 carbon atoms, b is zero, and a is a number having a value of from about 1 to about 2.

The above-disclosed functional cationic oligomers, when blended with an appropriate reactive diluent such as the above-mentioned monomers, form very flexible films possessing desirable physical and mechanical properties. However, one important disadvantage associated with the use of such film-forming composition relates to their slow cure rate. It has been surprisingly found that the use of certain transferring agents significantly increases the curing time of these types of compositions.

Examples of suitable transferring agents include alkoxylated hexanediols, aliphatic dimer-alcohol, polyol polytetramethylene glycol, poly(1,6 hexanediol/neopentyl glycol/diethylene glycol/adipic acid) diol and mixtures thereof.

The alkoxylated hexanediols which may be used include those containing from about 0.01 to about 20 moles of ethylene oxide and up to about 20 moles of propylene oxide.

Epoxy silicones which may be employed include those corresponding to the formula:

which are commercially available from OSi Specialties, Inc., of Danbury, Conn., under the tradenames SILQUEST® A-187 and SILQUEST® A-186.

A particularly preferred transferring agent for use in the present invention is an alkoxylated hexanediol containing from 2 to 4 moles of ethylene oxide or an aliphatic dimer-alcohol available from Cognis KGaA under the tradename Sovermol® 908.

Since the composition of the present invention requires (UV) radiation to be cured, a photoinitiator is needed in order to effectuate curing. Suitable photoinitiators include, but are not limited to, diazonium and aryl iodonium, phosphonium and sulfonium salts of anions of $BF_3$, $PF_6$, $AsF_6$, $SbF_6$ $FeCl_4$ $SbCl_6$, and the like. The most commonly used cationic photoinitiators are the triarylsulfonium salts of hexafluoro phosphate or antinomate. They are commercially available from Union Carbide under the tradenames CYRACURE® UVI 6990, CYRACURE® UVI 6992, CYRACURE® UVI 6974, CYRACURE® UVI 6976, and from 3M Corporation under the tradename Epoxy curative FX-512.

According to one embodiment of the present invention, there is provided a water-dispersible, radiation curable cationic resin composition containing: (a) from about 10 to about 90% by weight, preferably from about 25 to about 90% by weight, and most preferably from about 60 to about 80% by weight of a cationic oligomer; (b) from about 10 to about 30% by weight, preferably from about 15 to about 30% by weight, and most preferably from about 20 to about 25% by weight of an epoxy functional monomer; (c) from about 0.01 to about 30% by weight, preferably from about 5 to about 30% by weight, and most preferably from about 5 to about 20% by weight of a surfactant component; (d) from about 0.01 to about 10% by weight, preferably from about 0.1 to about 5% by weight, and most preferably from about 0.5 to about 2% by weight of a transfer agent; and (e) from about 1 to about 15% by weight, preferably from about 4 to about 10% by weight, and most preferably from about 4 to about 8% by weight of a photoinitiator, all weights being based on the total weight of the composition.

The above-disclosed coating composition can be used for coating any suitable substrate such as, for example, a metal, paper, textile, wood, glass, fiber glass, or fiber optic surface, on which a radiation curable coating would be desirable. More specific applications for the coating composition of the present invention include nickel screen coating, nickel mesh coating, textile printing and coil coating.

Thus, according to another embodiment of the present invention, there is provided a process for coating a substrate with a radiation curable coating composition involving applying onto a surface of the substrate the above-disclosed radiation curable coating composition. The radiation curable coating composition may be applied onto the substrate in any known, conventional manner.

According to yet another embodiment of the present invention, there is also provided a process for making a water-dispersible, radiation curable cationic resin composition involving: (a) providing from about 10 to about 90% by weight, preferably from about 25 to about 90% by weight, and most preferably from about 60 to about 80% by weight of a cationic oligomer; (b) providing from about 10 to about 30% by weight, preferably from about 15 to about 30% by weight, and most preferably from about 20 to about 25% by weight of an epoxy functional monomer; (c) providing from about 0.01 to about 30% by weight, preferably from about 5 to about 30% by weight, and most preferably from about 5 to about 20% by weight of a surfactant component; (d) providing from about 0.01 to about 10% by weight, preferably from about 0.1 to about 5% by weight, and most preferably from about 0.5 to about 2% by weight of a transfer agent; (e) providing from about 1 to about 15% by weight, preferably from about 4 to about 10% by weight, and most preferably from about 4 to about 8% by weight of a photoinitiator, all weights being based on the total weight of the composition; and (f) mixing components (a)–(e) to form the coating composition. Components (a)–(e) can be mixed in any conventional manner known for formulating radiation curable coating compositions.

The present invention will be better understood from the examples which follow, all of which are intended for illustrative purposes only, and are not meant to unduly limit the scope of the invention in any way.

EXAMPLES

An epoxy blend was prepared containing: (a) 72% by weight Bisphenol A-epichlorohydrin condensate, (b) 14% by weight diglycidyl ether, (c) 6% by weight block copolymer, (d) 2% by weight pigment, and (e) 6% by weight photoinitiator. The amount of diglycidyl ether was then reduced to 13.5% by weight at which time 0.5% by weight of organosilicone and 1,6 hexandiol, respectively, were added, in order to demonstrate the rapid cure rate obtained when adding these additives to a standard epoxy resin, as is evidenced by the data in the following tables.

| Epoxy | Time After Irradiation (hrs) | Hardness measured w/Konig Pendulum (secs) |
|---|---|---|
| | 0.08 | 21 |
| | 0.5 | 22 |
| | 1 | 23 |
| | 30 | 75 |
| | 124 | 72 |

| Epoxy + 0.5% organosilicone oligomer | Time After Irradiation (hrs) | Hardness measured w/Konig Pendulum (secs) |
|---|---|---|
| | 0.08 | 188 |
| | 0.5 | 183 |
| | 1 | 187 |
| | 21 | 215 |
| | 167 | 221 |

| Epoxy + 1,6 hexandiol | Time After Irradiation (hrs) | Hardness measured w/Konig Pendulum (secs) |
|---|---|---|
| | 1 | 223 |
| | 20.5 | 227 |
| | 24 | 225 |
| | 49 | 227 |
| | 115 | 220 |
| | 290 | 237 |

What is claimed is:

1. A process for making a water-dispersible, radiation curable coating composition comprising:
   (a) providing from about 10 to about 90% by weight of a cationic oligomer;
   (b) providing from about 10 to about 30% by weight of an epoxy functional monomer;
   (c) providing from about 0.01 to about 30% by weight of a surfactant component selected from the group consisting of an ethylene oxide/propylene oxide block copolymer, a polyhydroxy fatty acid amide, an alkyl polyglycoside, and mixtures thereof;
   (d) providing from about 0.01 to about 10% by weight of a transfer agent;
   (e) providing from about 1 to about 15% by weight of a photoinitiator, all weights being based on the weight of the composition; and
   (f) mixing (a)–(e) to form the coating composition.

2. The process of claim 1 wherein the cationic oligomer is selected from the group consisting of an epoxy oligomer, a vinyl ether oligomer and an organosilicone oligomer.

3. The process of claim 2 wherein the cationic oligomer is an epoxy oligomer.

4. The process of claim 3 wherein the epoxy oligomer is a diglycidyl ether of bisphenol A.

5. The process of claim 1 wherein the cationic oligomer is employed in an amount of from about 60 to about 80% by weight, based on the weight of the composition.

6. The process of claim 1 wherein the epoxy functional monomer is selected from the group consisting of a glycidyl ether of a polyhydric phenol, a glycidyl ether of a polyhydric alcohol, and mixtures thereof.

7. The process of claim 6 wherein the epoxy functional monomer is a diglycidyl ether of neopentyl glycol.

8. The process of claim 6 wherein the epoxy functional monomer is employed in an amount of from about 20 to about 25% by weight, based on the weight of the composition.

9. The process of claim 1 wherein the surfactant component is an ethylene oxide/propylene oxide block copolymer.

10. The process of claim 1 wherein the surfactant component is an alkyl polyglycoside.

11. The process of claim 1 wherein the surfactant component is employed in an amount of from about 5 to about 20% by weight, based on the weight of the composition.

12. The process of claim 1 wherein the transfer agent is selected from the group consisting of an alkoxylated hexanediol, an epoxy silicone, an amino silicone and mixtures thereof.

13. The process of claim 12 wherein the transfer agent is an alkoxylated hexanediol having from about 2 to about 4 moles of ethylene oxide.

14. The process of claim 1 wherein the transfer agent is employed in an amount of from about 0.5 to about 2% by weight, based on the weight of the composition.

15. The process of claim 1 wherein the photoinitiator is selected from the group consisting of a triarylsulfonium hexafluorophosphate salt, a triarylsulfonium hexafluoroantinomate salt, and mixtures thereof.

16. The process of claim 1 wherein the photoinitiator is employed in an amount of from about 4 to about 8% by weight, based on the weight of the composition.

17. The product of the process of claim 1.
18. The product of the process of claim 2.
19. The product of the process of claim 3.
20. The product of the process of claim 4.
21. The product of the process of claim 5.
22. The product of the process of claim 6.
23. The product of the process of claim 7.
24. The product of the process of claim 8.
25. The product of the process of claim 9.
26. The product of the process of claim 10.
27. The product of the process of claim 11.
28. The product of the process of claim 12.
29. The product of the process of claim 13.
30. The product of the process of claim 14.
31. The product of the process of claim 15.
32. The product of the process of claim 16.

33. A water-dispersible, radiation curable coating composition comprising:
   (a) from about 10 to about 90% by weight of a cationic oligomer;
   (b) from about 10 to about 30% by weight of an epoxy functional monomer;
   (c) from about 0.01 to about 30% by weight of a surfactant component selected from the group consisting of an ethylene oxide/propylene oxide block copolymer, a polyhydroxy fatty acid amide, an alkyl polyglycoside, and mixtures thereof;
   (d) from about 0.0 to about 10% by weight of a transfer agent; and
   (e) from about 1 to about 15% by weight of a photoinitiator, all weights being based on the weight of the composition.

34. The composition of claim 33 wherein the cationic oligomer is selected from the group consisting of an epoxy oligomer, a vinyl ether oligomer and an organosilicone oligomer.

35. The composition of claim 34 wherein the cationic oligomer is an epoxy oligomer.

36. The composition of claim 35 wherein the epoxy oligomer is a diglycidyl ether of bisphenol A.

37. The composition of claim 33 wherein the cationic oligomer is employed in an amount of from about 60 to about 80% by weight, based on the weight of the composition.

38. The composition of claim 33 wherein the epoxy functional monomer is selected from the group consisting of a glycidyl ether of a polyhydric phenol, a glycidyl ether of a polyhydric alcohol, and mixtures thereof.

39. The composition of claim 38 wherein the epoxy functional monomer is a diglycidyl ether of neopentyl glycol.

40. The composition of claim 38 wherein the epoxy functional monomer is employed in an amount of from about 20 to about 25% by weight, based on the weight of the composition.

41. The composition of claim 35 wherein the surfactant component is an ethylene oxide/propylene oxide block copolymer.

42. The composition of claim 35 wherein the surfactant component is an alkyl polyglycoside.

43. The composition of claim 33 wherein the surfactant component is employed in an amount of from about 5 to about 20% by weight, based on the weight of the composition.

44. The composition of claim 33 wherein the transfer agent is selected from the group consisting of an alkoxylated hexanediol, an epoxy silicone, an amino silicone and mixtures thereof.

45. The composition of claim 44 wherein the transfer agent is an alkoxylated hexanediol having from about 2 to about 4 moles of ethylene oxide.

46. The composition of claim 33 wherein the transfer agent is employed in an amount of from about 0.5 to about 2% by weight, based on the weight of the composition.

47. The composition of claim 33 wherein the photoinitiator is selected from the group consisting of a triarylsulfonium hexafluorophosphate salt, a triarylsulfonium hexafluoroantinomate salt, and mixtures thereof.

48. The composition of claim 33 wherein the photoinitiator is employed in an amount of from about 4 to about 8% by weight, based on the weight of the composition.

49. A process for coating a substrate with a radiation curable coating composition comprising applying onto a surface of the substrate the coating composition of claim 33 and exposing the composition to ultraviolet radiation.

\* \* \* \* \*